(12) United States Patent
Kim

(10) Patent No.: US 7,738,764 B2
(45) Date of Patent: Jun. 15, 2010

(54) LIGHT EMITTING DEVICE PACKAGE AND METHOD OF MANUFACTURING THE SAME

(75) Inventor: Geun Ho Kim, Seoul (KR)

(73) Assignees: LG Electronics Inc., Seoul (KR); LG Innotek Co., Ltd., Seoul (KR)

( * ) Notice: Subject to any disclaimer, the term of this patent is extended or adjusted under 35 U.S.C. 154(b) by 0 days.

(21) Appl. No.: 11/707,140

(22) Filed: Feb. 16, 2007

(65) Prior Publication Data

US 2007/0200131 A1  Aug. 30, 2007

(30) Foreign Application Priority Data

Feb. 28, 2006 (KR) .................... 10-2006-0019562

(51) Int. Cl.
*G02B 6/00* (2006.01)
*H01L 29/267* (2006.01)
*H01L 29/207* (2006.01)

(52) U.S. Cl. .................... 385/147; 257/81; 257/93
(58) Field of Classification Search .................... 257/81, 257/93

See application file for complete search history.

(56) References Cited

U.S. PATENT DOCUMENTS

| 2002/0027229 | A1* | 3/2002 | Yamazaki et al. | 257/84 |
| 2005/0051789 | A1 | 3/2005 | Negley et al. | |
| 2005/0230692 | A1* | 10/2005 | Kim et al. | 257/79 |
| 2006/0132401 | A1* | 6/2006 | Yamazaki et al. | 345/81 |

FOREIGN PATENT DOCUMENTS

| CN | 1684281 A | 10/2005 |
| EP | 1 587 151 A2 | 10/2005 |
| JP | 2004-259846 A | 9/2004 |

* cited by examiner

*Primary Examiner*—Uyen-Chau N Le
*Assistant Examiner*—Chris H Chu
(74) *Attorney, Agent, or Firm*—Birch, Stewart, Kolasch & Birch, LLP

(57) ABSTRACT

A light emitting device package and a method of manufacturing the same are disclosed. The light emitting device package includes a package structure, two diffusion layers formed on the package structure such that the two diffusion layers are electrically separated from each other, and first and second electrodes insulated from the package structure by an insulation film. The first and second electrodes are electrically connected with the two diffusion layers, respectively.

23 Claims, 8 Drawing Sheets

RELATED ART

LIGHT EMITTING DEVICE PACKAGE AND METHOD OF MANUFACTURING THE SAME

CROSS-REFERENCE TO RELATED APPLICATION

This application claims the benefit of Korean Patent Application No. 10-2006-0019562, filed on Feb. 28, 2006, which is hereby incorporated by reference in its entirety as if fully set forth herein.

BACKGROUND OF THE INVENTION

1. Field of the Invention

The present invention relates to a light emitting device package and a method of manufacturing the same, and more particularly, to a light emitting device package wherein no Zener diode is mounted in the light emitting device package, and therefore, the light emitting device package can be used as a thin surface mount device (SMD), and a method of manufacturing the same.

2. Discussion of the Related Art

Generally, it is possible for a light emitting device, such as a light emitting diode or a laser diode, using Group III to IV or Group II to VI compound semiconductor materials of a direct transition compound semiconductor to emit various color light, including red color light, green color light, blue color light, and ultraviolet rays, with the development of a thin film growing technology and device materials. Also, it is possible for the light emitting device to emit white color light having high efficiency through the use of a fluorescent material or the combination of colors. With the progress of such a technology, the light emitting device has been increasingly applied to a transmission module of optical communication equipment, a light emitting diode backlight substituting a cold cathode fluorescent lamp (CCFL) constituting a backlight of a liquid crystal display (LCD), a white light emitting diode illuminating apparatus, a headlight for vehicles, and a signal light as well as a display device.

Hereinafter, the structure of a conventional light emitting device and a conventional light emitting device package will be described in brief with reference to the accompanying drawings.

FIG. 1 is a sectional view schematically illustrating the structure of a light emitting device mounted in a conventional light emitting device package. The structure of the conventional light emitting device will be described with reference to FIG. 1.

As shown in FIG. 1, the conventional light emitting diode includes a substrate 10, a buffer layer 11, an n-semiconductor layer 12, an active layer 13, a p-semiconductor layer 14, a transparent electrode 15, an n-electrode 16, and a p-electrode 17. Specifically, the buffer layer 11 and the n-semiconductor layer 12 are sequentially stacked on the substrate 10. At this time, a portion of the n-semiconductor layer 12 is etched to a predetermined depth, and the n-electrode 16 is formed on the etched portion of the n-semiconductor layer 12. The active layer 13, the p-semiconductor layer 14, and the transparent electrode 15 are sequentially stacked on the remaining portion of the n-semiconductor layer 12, which is not etched. The p-electrode 17 is formed on the transparent electrode 15.

When voltage from an external circuit is applied between the p-electrode 17 and the n-electrode 16 of the light emitting diode, holes and electrons are injected into the light emitting diode through the p-electrode 17 and the n-electrode 16, respectively. The holes and electrons are recoupled with each other in the active layer 13. As a result, residual energy is converted into light, which is discharged to the outside through the transparent electrode 15 and the substrate 10. The light emitting diode with the above-stated construction is mounted in a semiconductor device package, is changed into an electronic part through a predetermined process, and is then attached to a printed circuit board (PCB) together with other electronic parts. The semiconductor device package may be classified as an insertion type package or a surface mount type package.

The surface mount type package is highly integrated, is constructed in a thin form, and enables the embodiment of a system integration package as compared to the insertion type package. Consequently, a light emitting device package is mainly manufactured in the form of the surface mount type package.

FIG. 2 is a sectional view illustrating the structure of a conventional light emitting device package. The structure of the conventional light emitting device package will be described with reference to FIG. 2.

As shown in FIG. 2, a light emitting diode 30 and a Zener diode 40 are mounted on the upper surface of a first lead 21. The light emitting diode 30 is electrically connected to a second lead 22 and the Zener diode 40 via first bonding wires 52-1 and 52-2, respectively. The Zener diode 40 is electrically connected to the light emitting diode 30 and the first lead 21 via second bonding wires 54-1 and 54-2, respectively. The first lead 21, the second lead 22, the light emitting diode 30, and the Zener diode 40 are shielded by a molding part 60.

In the surface mount type light emitting device package with the above-stated construction, the light emitting diode is weak to static electricity or reverse voltage. For this reason, the light emitting device package further includes a bypass device for bypassing reverse current in order to complement the weakness of the light emitting diode. The Zener diode 40 is mainly used as the bypass device. As shown in FIG. 2, the Zener diode is electrically connected in parallel with the light emitting diode 30. Specifically, the Zener diode 40 is die-bonded using an adhesive resin, and then an n-electrode of the light emitting diode 30 and a p-electrode of the Zener diode 40 are connected in parallel with each other. Also, a p-electrode of the light emitting diode 30 and an n-electrode of the Zener diode 40 are connected in parallel with each other.

The Zener diode may be constructed in a pn junction structure (Zener breakdown occurs only in the reverse direction.) and a pnp (or npn) junction structure. In the pn junction structure, Zener breakdown occurs, and therefore, current is bypassed, only when the voltage is a reverse voltage. In the pnp (or npn) junction structure, on the other hand, Zener breakdown occurs, and therefore, current is bypassed, even when the voltage is a forward voltage as well as a reverse voltage. Consequently, the pnp (or npn) junction structure serves to safely protect the light emitting diode from abnormal current generated due to overvoltage or static electricity caused by external environment. The Zener diode having the pnp (or npn) junction structure is also called a back-to-back Zener diode. The electrodes of the Zener diode exhibit the same polarity, and therefore, the Zener diode has an advantage in that the Zener diode can be connected in parallel with the light emitting diode 30 irrespective of the polarities.

However, the conventional light emitting device package has the following problems.

The conventional surface mount type light emitting device package includes the metal leads. For this reason, there is needed an additional space necessary for mounting the protection device, such as the Zener diode. As a result, the total weight and size of the package are increased. Furthermore, a die bonding process for mounting the device and a wire bonding process for electrically connecting the device are individually carried out. Consequently, the process for manufacturing the light emitting device package is complicated and troublesome, and therefore, costs and time necessary for manufacturing the light emitting device package are increased.

In addition, it is difficult to manufacture the conventional light emitting device package through plastic injection molding, and therefore, the miniaturization and thin shaping of the light emitting device package are limited. Consequently, the conventional light emitting device package is not suitable for a current tendency requiring the reduction in weight and size of electronic products.

SUMMARY OF THE INVENTION

Accordingly, the present invention is directed to a light emitting device package and a method of manufacturing the same that substantially obviate one or more problems due to limitations and disadvantages of the related art.

An object of the present invention is to provide a light emitting device package wherein a light emitting device is mounted in a mounting groove formed by etching a silicon substrate using a bulk micro machining technology, whereby the function of a Zener diode for preventing the damage to the light emitting device from static electricity and reverse voltage is realized in the light emitting device package, and a method of manufacturing the same.

Another object of the present invention is to provide a light emitting device package wherein at least one diffusion layer is electrically connected in parallel with the light emitting device, whereby an additional protection device is not needed, and therefore, the size, especially the thickness, of the light emitting device package is reduced, and a method of manufacturing the same which does not include a process for mounting the protection device.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a light emitting device package includes a package structure, two diffusion layers formed on the package structure such that the two diffusion layers are electrically separated from each other, and first and second electrodes insulated from the package structure by an insulation film, the first and second electrodes being electrically connected with the two diffusion layers, respectively.

In another aspect of the present invention, a light emitting device package includes a package structure, a diffusion layer formed on the package structure, and first and second electrodes insulated from the package structure by an insulation film, the first electrode being electrically connected with the diffusion layer.

In a further aspect of the present invention, a method of manufacturing a light emitting device package includes forming at least one diffusion layer on a first surface of a substrate, and forming first and second electrodes such that the first and second electrodes are insulated from the substrate and are electrically connected with the at least one diffusion layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

A light emitting device package according to the present invention is characterized in that a diffusion layer is formed in the lower part of a substrate such that the diffusion layer is electrically connected in parallel with a light emitting device, and a mounting groove is formed in the upper part of the substrate using a bulk micro machining technology. Also, the light emitting device package according to the present invention is characterized in that the light emitting device is attached to the substrate using a flip chip bonding method.

Figure 1:
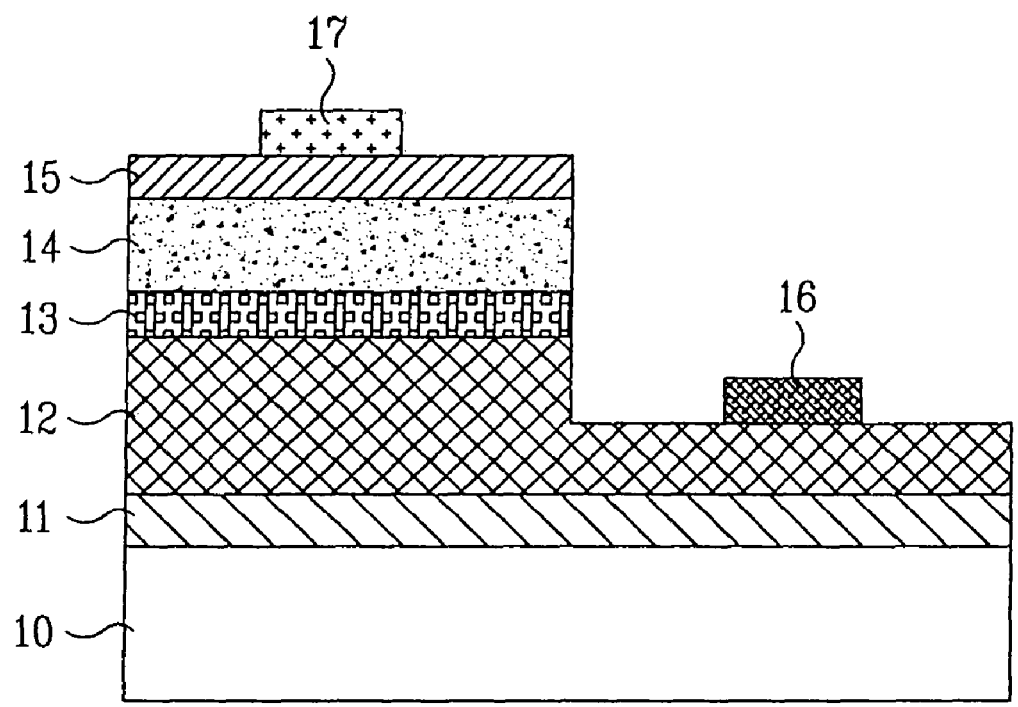
FIG. 1 is a sectional view schematically illustrating the structure of a light emitting device mounted in a conventional light emitting device package.
Figure 2:
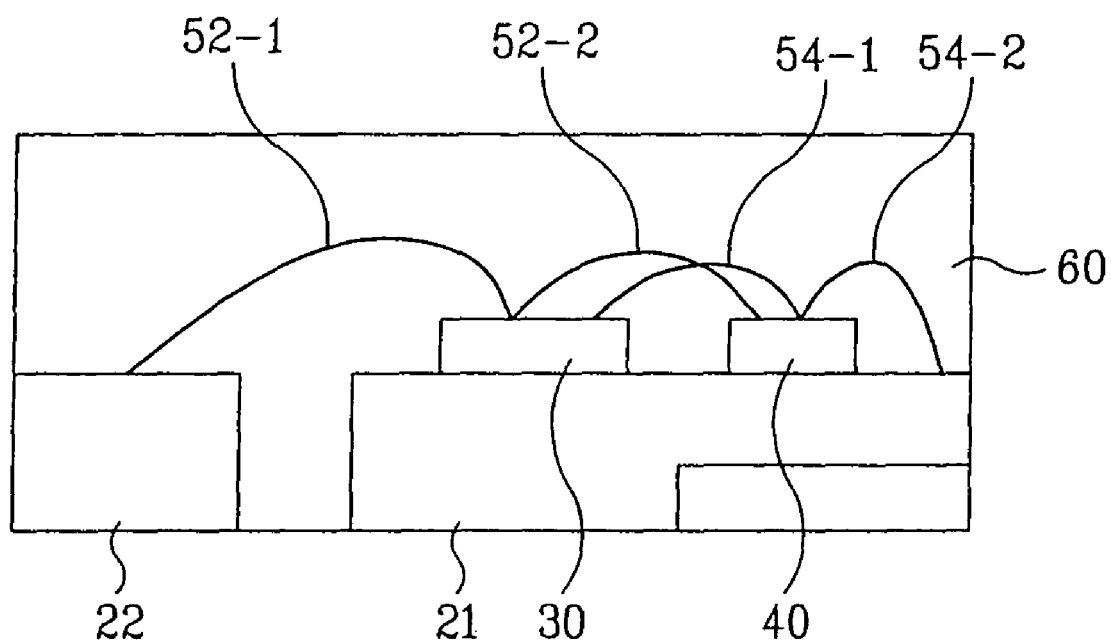
FIG. 2 is a sectional view illustrating the structure of a conventional light emitting device package.
Figure 3:
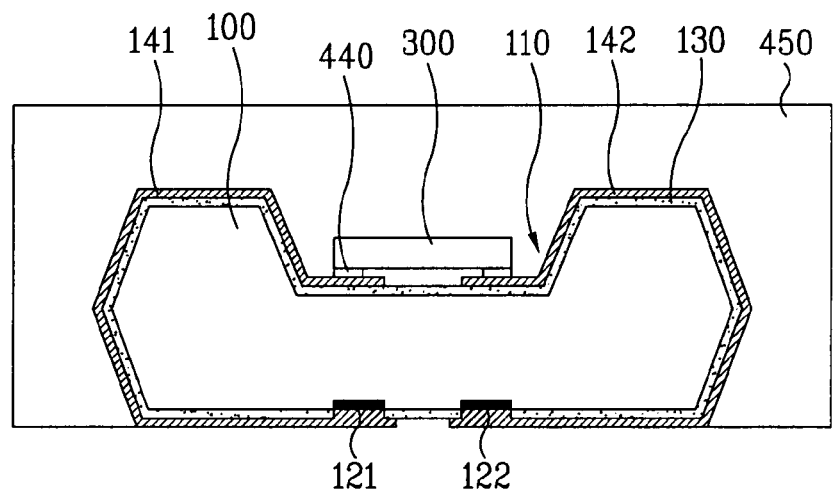
FIG. 3 is a sectional view illustrating a first embodiment of light emitting device package according to the present invention.

FIG. 3 is a sectional view illustrating a first embodiment of light emitting device package according to the present invention. Hereinafter, a first embodiment of light emitting device package according to the present invention will be described in detail with reference to FIG. 3.

As shown in FIG. 3, the light emitting device package according to this embodiment includes a package structure 100, diffusion layers 121 and 122, an insulation film 130, first and second electrodes 141 and 142, a light emitting device 300, and a molding part 450. In this embodiment, the light emitting device package includes two diffusion layers 121 and 122. Consequently, the same function as a Zener diode having a back-to-back or npn (pnp) junction structure is realized in the light emitting device package.

The package structure 100 may be made of silicon, ceramic, or plastic. The package structure 100 is characterized in that a mounting groove 110 is formed in the upper part of the package structure 100, and the two diffusion layers 121 and 122 are formed in the lower part of the package structure 100. The mounting groove 110 is characterized in that the mounting groove 110 is flat at the bottom surface thereof, but the mounting groove 110 is inclined at the side surface thereof. The two diffusion layers 121 and 122 are spaced apart from each other. Since the two diffusion layers 121 and 122 are formed in the lower part of the package structure 100 while being spaced apart from each other as described above, the same function as a back-to-back Zener diode, i.e., a Zener diode having an npn or pnp junction structure, is realized in the light emitting device package.

In order to realize the above-mentioned function, it is preferable that the region of the package structure where the diffusion layers 121 and 122 are formed and the remaining region of the package structure where the diffusion layers 121 and 122 are not formed have different electrical polarities, and the two diffusion layers 121 and 122 have the same polarity. For example, when the polarity of the package structure 100 is of an n type, the diffusion layers 121 and 122 must be formed of a p type. When the polarity of the package structure 100 is of a p type, on the other hand, the diffusion layers 121 and 122 must be formed of an n type. In the above-described back-to-back Zener diode, the electrodes located at opposite sides of Zener diode exhibit the same polarity. Consequently, the electrodes may be connected irrespective of the polarity of a power source inputted when forming a circuit (i.e., when connecting the Zener diode to a light emitting device, which will be described below).

The insulation film 130 is formed on the package structure 100. Specifically, the insulation film 130 is formed at the upper and lower surfaces of the package structure 100 excluding the two diffusion layers 121 and 122 regions. The insulation film 130 is also formed at the entire side surface of the package structure 100. The insulation film 130 is provided to prevent the remaining region of the package structure 100 where the diffusion layers 121 and 122 are not formed and the first and second electrodes 141 and 142, which will be described below, from being electrically connected with each other. The first and second electrodes 141 and 142 are formed on the insulation film 130. The first electrode 141 extends from the diffusion layer 121 region to a portion of the insulation film 130 formed at the bottom surface of the mounting groove 110 via the insulation film formed at one side surface of the package structure 100. Similarly to the first electrode 141, the second electrode 142 extends from the diffusion layer 122 region to a portion of the insulation film 130 formed at the bottom surface of the mounting groove 110 via the insulation film formed at the other side surface of the package structure 100. The first electrode 141 and the second electrode 142 are spaced a predetermined distance from each other at the top and bottom of the package structure 100 such that the electrical connection between the first electrode 141 and the second electrode 142 is prevented.

The light emitting device 300 is attached to the bottom surface of the mounting groove 110. Specifically, the light emitting device 300 is flip-chip bonded on the first and second electrodes 141 and 142 using solder 440. As described above, the first and second electrodes 141 and 142 are formed on the insulation film 130 at the bottom surface region of the mounting groove 110. One electrode of the light emitting device 300 is electrically connected with the diffusion layer 121 via the first electrode 141. The other electrode of the light emitting device 300 is electrically connected with the diffusion layer 122 via the second electrode 142. That is, a protection circuit electrically connected with the light emitting device 300 is formed in the package structure 100 using the diffusion layers 121 and 122, whereby the same function as the Zener diode is carried out by the protection circuit.

The molding part 450 is formed such that the mounting groove 110 is filled with the molding part 450, and the molding part 450 covers the top and side of the package structure 100. Preferably, the molding part 450 is made of a mixture including molding-purpose composite resin powder and fluorescent powder. The molding part 450 serves to protect the light emitting device 300.

In the first embodiment of light emitting device package with the above-described construction according to the present invention, the light emitting device 300 is mounted in the mounting groove 110 formed at the package structure 100. Consequently, light generated from an active layer of the light emitting device 300 is effectively reflected forward (upward on the drawing), and therefore, the light emission efficiency of the light emitting device package is improved. Specifically, the first and second electrodes 141 and 142 formed at the inside surface of the mounting groove 110 serve as a kind of reflection mirror. Also, the light emitting device 300 is mounted on the first and second electrodes 141 and 142, which are formed on the insulation film 130 at the bottom surface region of the mounting groove 110 formed in the middle region of the upper part of the package structure 100, by a flip chip bonding process using a conductive bonding agent, such as the solder 440. Consequently, a troublesome process, such as a wire bonding process, is omitted.

Figure 4:
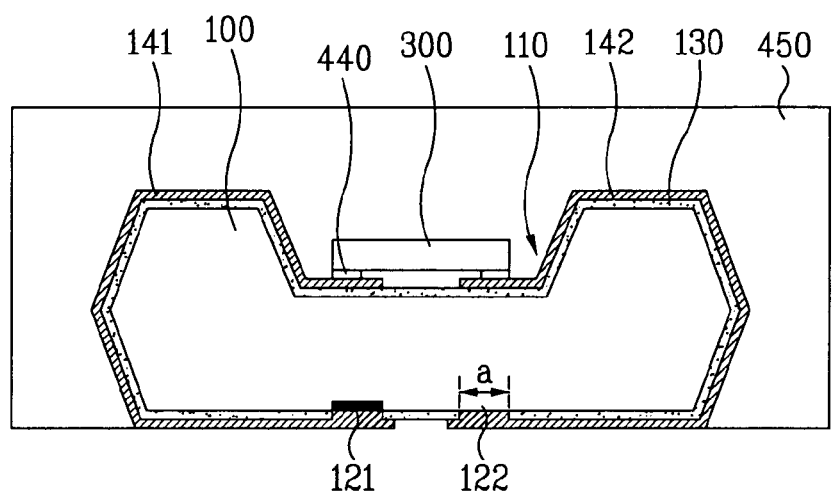
FIG. 4 is a sectional view illustrating a second embodiment of light emitting device package according to the present invention.

FIG. 4 is a sectional view illustrating a second embodiment of light emitting device package according to the present invention. Hereinafter, a second embodiment of light emitting device package according to the present invention will be described in detail with reference to FIG. 4.

As shown in FIG. 4, the light emitting device package according to this embodiment includes a package structure 100, a diffusion layer 121, an insulation film 130, first and second electrodes 141 and 142, a light emitting device 300, and a molding part 450. This embodiment is characterized in that the light emitting device package includes a single diffusion layer 121, and therefore, the same function as a Zener diode having a pn (np) junction structure is realized in the light emitting device package. The connection between the components of the light emitting device package is mostly identical to that of the light emitting device package according to the previous first embodiment except that no additional diffusion layer is formed at a predetermined region a spaced apart from the diffusion layer 121, the region a is electrically connected with the second electrode 142. Similarly to the description given in connection with FIG. 3, it is preferable that the electrical polarity of the diffusion layer 121 is different from that of the remaining region of the package structure 100 where the diffusion layer 121 is not formed. With this construction, the same function as a Zener diode having a pn or np junction structure is realized in the package structure 100.

According to the second embodiment of light emitting device package with the above-stated construction, the diffusion layer 121 having a polarity opposite to that of the package structure 100 is formed at the package structure 100, and therefore, it is possible to realize the function of a protection device, such as a Zener diode, for protecting the circuit and the light emitting device from static electricity or reverse voltage. As a result, the provision of such a protection device is unnecessary, and therefore, a space for receiving the protection device is not needed. Furthermore, a mounting process, such as wire bonding, is omitted. Consequently, it is possible to miniaturize the light emitting device package, and it is possible to reduce costs and time necessary for manufacturing the light emitting device package. In addition, the light emitting device package according to this embodiment does not include any lead, and therefore, it is possible to reduce the thickness of the light emitting device package.

FIGS. 5A to 5I are sectional views illustrating an embodiment of light emitting device package manufacturing method according to the present invention. Hereinafter, an embodiment of light emitting device package manufacturing method according to the present invention will be described in detail with reference to FIGS. 5A to 5I.

Figure 5A:
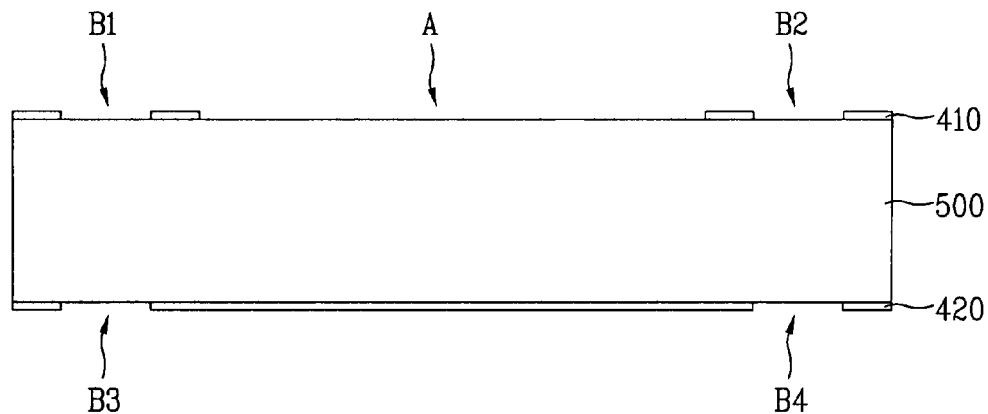
FIGS. 5A to 5I are sectional views illustrating an embodiment of light emitting device package manufacturing method according to the present invention.

First, as shown in FIG. 5A, mask layers 410 and 420 to form through-holes and a mounting groove are formed on a substrate 500. The upper mask layer 410 is formed on the remaining region of the substrate 500 excluding a region A where the mounting groove will be formed and regions B1 and B2 where the through-holes will be formed. The lower mask layer 420 is formed on the remaining region of the substrate 500 excluding regions B3 and B4 where the through-holes will be formed. However, it is not necessary to use the mask layers having the above-described shapes, and mask layers having shapes opposite to those of the illustrated mask layers may be used depending upon etching methods or etching materials used for etching. The substrate 500 may be a silicon substrate. The substrate 500 may be etched using an anisotropic wet-type etching method through a bulk micro machining process.

Figure 5B:
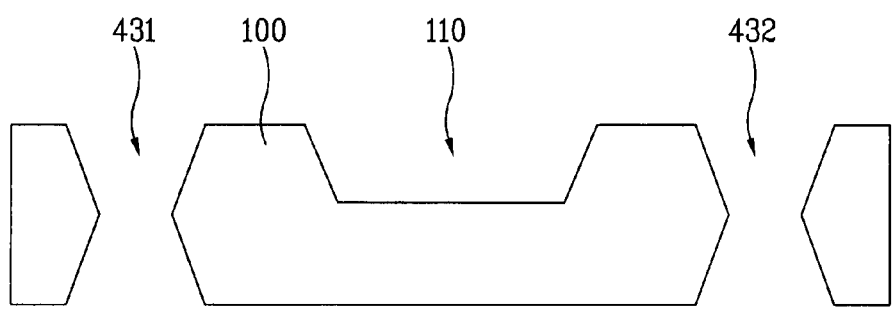

Subsequently, as shown in FIG. 5B, a pair of through-holes 431 and 432 are formed through the substrate 500. In the upper part of the substrate between the through-holes 431 and 432 is formed a mounting groove 110, and then the mask layers 410 and 420 are removed. When the etching is performed using the above-mentioned anisotropic wet-type etching method, the through-holes 431 and 432 are formed into a shape as shown in FIG. 5B. Specifically, the through-holes 431 and 432 extend from the top to bottom of the substrate. The through-holes 431 and 432 are inclined from the top to the center of the substrate. Also, the through-holes 431 and 432 are inclined from the bottom to the center of the substrate. The mounting groove 110 is formed such that the inside surface of the mounting groove 110 is inclined to the middle of the mounting groove 110.

FIGS. 5A and 5B illustrate that a pair of through-holes 431 and 432 and a mounting groove 110 are provided at the substrate 500. During the actual manufacture of the light emitting device package, however, a plurality of through-holes and a plurality of grooves may be formed by unit of a wafer.

Figure 5C:
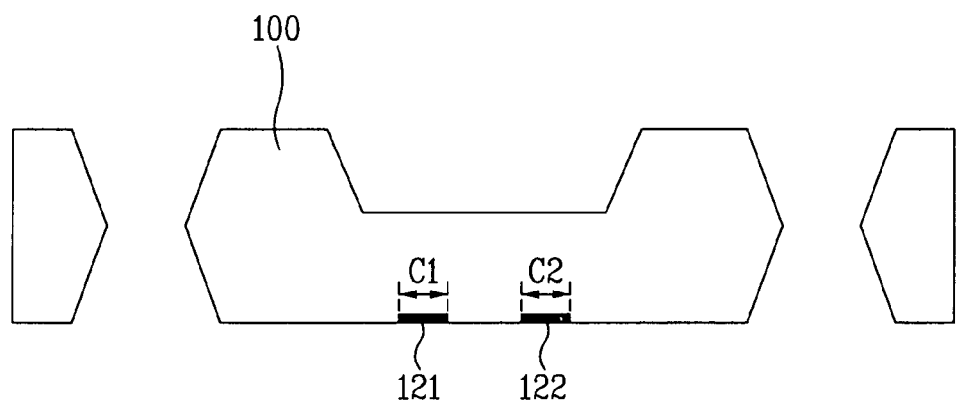

Subsequently, as shown in FIG. 5C, a semiconductor dopant is diffused to two separated regions C1 and C2 located at the lower part of the substrate 500 between the through-holes 431 and 432 such that diffusion layers 121 and 122 are formed at the two separated regions C1 and C2, respectively. At this time, the diffusion layers 121 and 122 have an electrical polarity opposite to that of the substrate 500. The diffusion layers 121 and 122 are formed through a semiconductor manufacturing process, such as high-concentration ion injection and semiconductor dopant diffusion. For example, when the substrate 500 is made of p-type silicon, a high-concentration n-type dopant is injected to form the diffusion layers 121 and 122. When the substrate 500 is made of n-type silicon, on the other hand, a high-concentration p-type dopant is injected to form the diffusion layers 121 and 122.

In this embodiment, the two diffusion layers 121 and 122 are formed in the lower part of the substrate 500 such that the same function as a back-to-back Zener diode can be realized in the light emitting device package. However, it is also possible to form only a single diffusion layer such that the same function as a pn or np Zener diode, in which Zener breakdown occurs only in the reverse direction, can be realized in the light emitting device package.

Figure 5D:
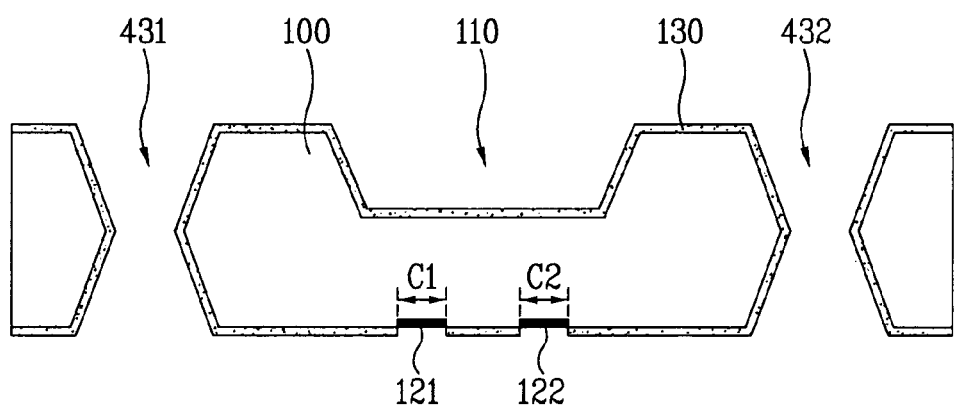

Subsequently, as shown in FIG. 5D, an insulation film 130 is formed on the substrate 500. At this time, the insulation film 130 is formed at the entire surface of the substrate 500 excluding the two separated regions C1 and C2 where the two diffusion layers 121 and 122 are formed. The insulation film 130 serves to prevent the electrical connection between first and second electrodes, which will be formed in a subsequent process, and the substrate 500.

Figure 5E:
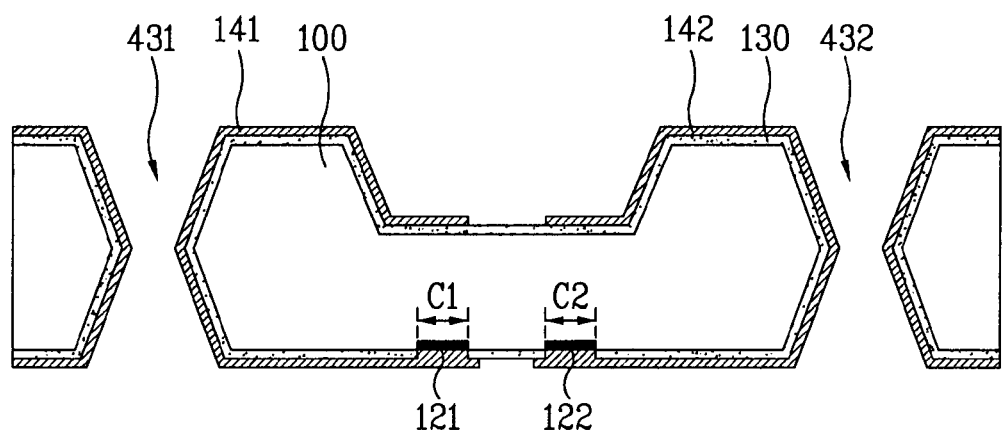

Subsequently, as shown in FIG. 5E, a first electrode 141 is formed such that the first electrode 141 extends from the region C1, where the diffusion layer 121 is formed, located at the lower part of the substrate 500 to a portion of the bottom surface of the mounting groove 110 located at the upper part of the substrate 500 via the through-hole 431. Also, a second electrode 142 is formed such that the second electrode 142 extends from the region C2, where the diffusion layer 122 is formed, located at the lower part of the substrate 500 to a portion of the bottom surface of the mounting groove 110 located at the upper part of the substrate 500 via the through-hole 432. At this time, it is preferable that the first electrode 141 and the second electrode 142 are spaced a predetermined distance from each other at the bottom surface region of the mounting groove 110.

Figure 5F:
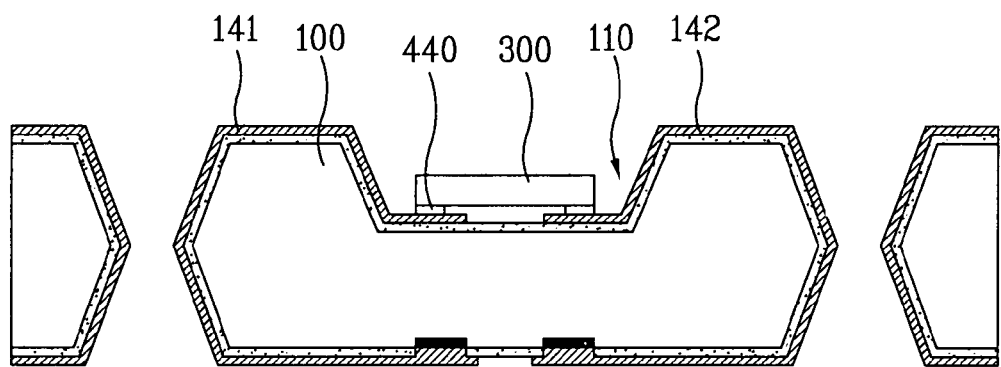

Subsequently, as shown in FIG. 5F, a light emitting device 300 is mounted on the first and second electrodes 141 and 142 formed at the bottom surface region of the mounting groove 110. At this time, the light emitting device 300 is flip-chip bonded to the tops of the first and second electrodes 141 and 142 formed at the bottom surface region of the mounting groove 110 using a conductive bonding agent, such as solder 440. Specifically, the light emitting device 300 is positioned on the solder 440, and heat and pressure are applied to the light emitting device 300. As a result, the solder 440 is molten, and therefore, the solder 440 is joined to the light emitting device 300. As the temperature of the light emitting device 300 is decreased, the solder 440 is hardened, whereby the electrically and mechanically stable connection between the light emitting device 300 and the first and second electrodes 141 and 142 is accomplished.

In this embodiment, the light emitting device 300 is mounted by the flip chip bonding. However, it is also possible to mount the light emitting device 300 by wire bonding. Specifically, the light emitting device 300 may be electrically connected to the first and second electrodes 141 and 142 using conductive wires.

Figure 5G:
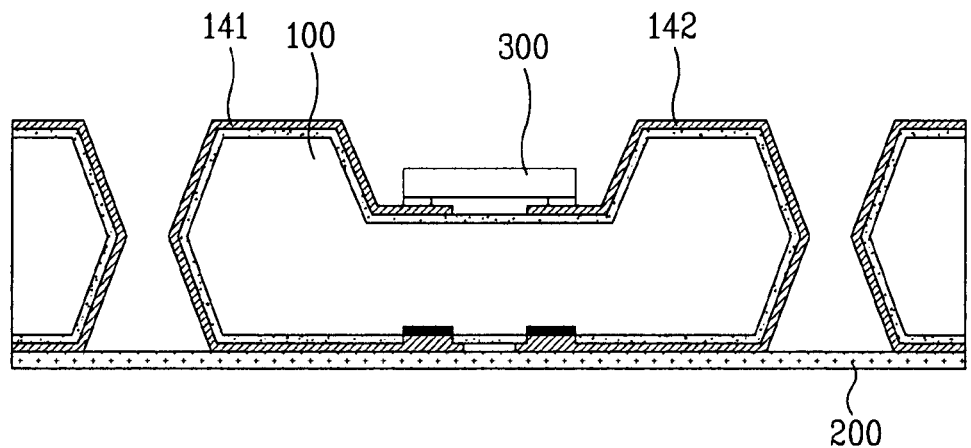

Subsequently, as shown in FIG. 5G, tape 200 is attached to the bottom of the substrate 500. Specifically, the tape 200 is attached to the lower surfaces of the first and second electrodes 141 and 142 formed at the substrate 500. The tape 200 serves to prevent the lower surfaces of the electrodes, which will be joined to a circuit board in a subsequent transfer molding process, from being contaminated due to molding resin, which is an insulative material, and to prevent the occurrence of incomplete, i.e., defective, electrical connection therebetween.

Figure 5H:
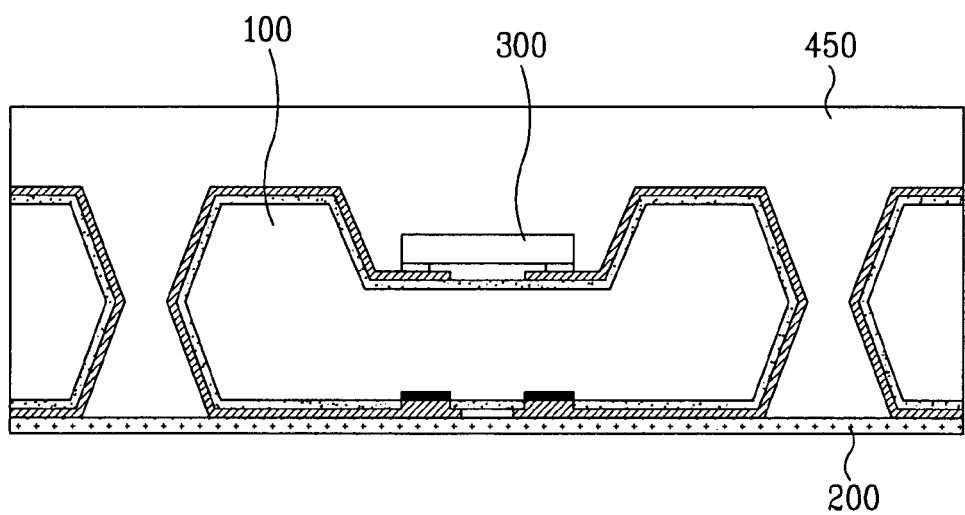

Subsequently, as shown in FIG. 5H, a molding part 450 is formed on the substrate 500 such that the through-holes 431 and 432 are filled with the molding part 450, and the mounting groove 110, in which the light emitting device 300 is mounted, is filled with the molding part 450. Preferably, the molding part 450 is made of a mixture including molding-purpose composite resin powder and fluorescent powder. The wavelength of light emitted from the light emitting device 300 is changed by the molding part 450, whereby it is possible to discharge various colored light including white color light.

Figure 5I:
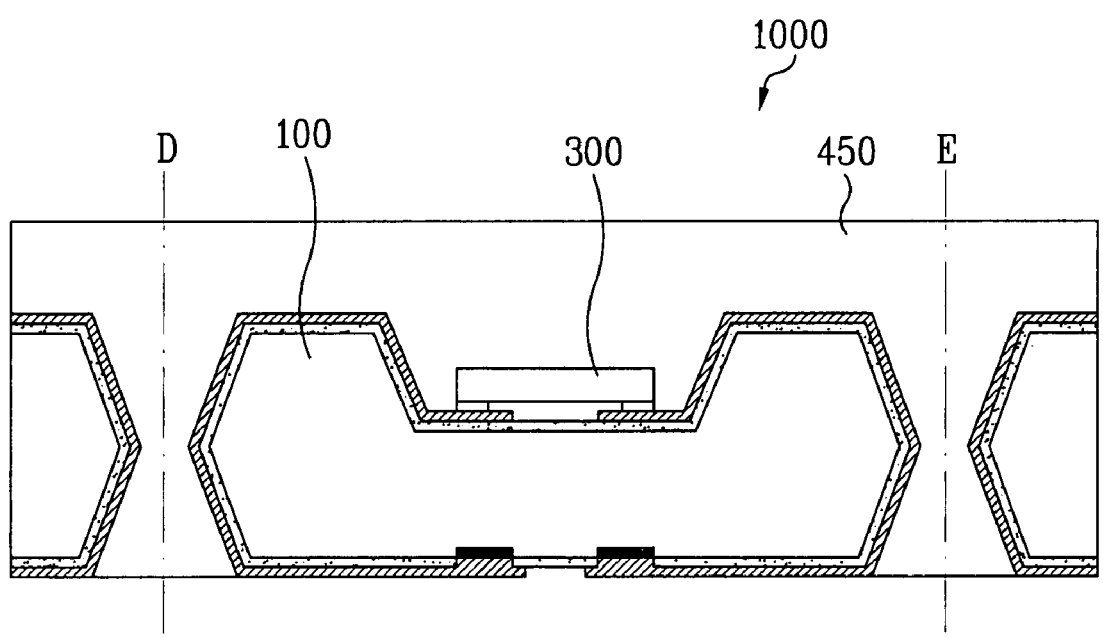

Finally, as shown in FIG. 5I, the substrate 500 is vertically cut along central lines D and E of the through-holes 431 and 432 to separate a region 1000 having the light emitting device mounted therein, i.e., a light emitting device package, from the remaining portion of the substrate 500. Specifically, the light emitting device package 1000 is separated from the remaining portion of the substrate 500 by a scribing or breaking process.

As apparent from the above description, the light emitting device package and the method of manufacturing the same according to the present invention use a package structure processed by anisotropic etching of a silicon substrate using a bulk micro machining technology. Consequently, the present invention has the effect of reducing the size, especially the thickness, and the weight of the package structure as compared to a conventional package structure manufactured by plastic injection molding. Furthermore, the electrodes having predetermined inclination and high reflexibility are formed at the side surface of the mounting groove, in which the light emitting device is mounted. Consequently, the light discharge efficiency of the present invention is improved.

Also, the protection circuit having a pn or pnp (npn) structure is formed in the light emitting device package through a dopant ion injection or diffusion process, and the protection circuit is electrically connected in parallel with the light emitting device. Consequently, the damage to the light emitting device due to static electricity or reverse voltage is prevented. In addition, the present invention does not need any additional Zener diode. Consequently, a space for mounting the Zener diode is not needed, and therefore, it is possible to miniaturize the light emitting device package. Furthermore, only the process for bonding the light emitting device using flip chip bonding is performed. As a result, the device bonding process and the wire bonding process are simplified, and therefore, costs and time necessary for manufacturing the light emitting device package are reduced.

Also, the light emitting device package and the method of manufacturing the same according to the present invention do not use leads. Consequently, it is possible to greatly reduce the thickness of the light emitting device package.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A light emitting device package, comprising:
   a package structure having a first surface, a second surface and a mounting groove in the first surface;
   at least one electrically conductive diffusion region located on the package structure; and
   a first electrode and a second electrode insulated from the package structure by an insulation film, at least one of the first and second electrodes being electrically connected with the at least one electrically conductive diffusion region,
   wherein the first electrode and second electrode each include an upper electrode portion located on the first surface of the package structure electrically connected to a lower electrode portion located on the second surface of the package structure, and
   wherein the first surface and the second surface are located on opposite sides of the package structure.

2. The light emitting device package according to claim 1, wherein the package structure includes at least one of silicon, ceramic, and plastic.

3. The light emitting device package according to claim 1, wherein the mounting groove has an inclined side surface.

4. The light emitting device package according to claim 3, further comprising:
   a light emitting device disposed in the mounting groove, the light emitting device being electrically connected with the first electrode and the second electrode.

5. The light emitting device package according to claim 4, further comprising:
   a molding part arranged to fill a space defined between the light emitting device and the mounting groove, and the molding part arranged to seal the package structure.

6. The light emitting device package according to claim 5, wherein the molding part comprises a mixture including composite resin powder and fluorescent powder.

7. The light emitting device package according to claim 4, wherein the first electrode and the second electrode comprise a material having high reflexibility.

8. The light emitting device package according to claim 1, wherein the insulation film is formed substantially on an entire surface of the package structure excluding a region where the at least one electrically conductive diffusion region is formed.

9. The light emitting device package according to claim 1, where the at least one electrically conductive diffusion region located on the package structure includes two diffusion regions located on the package structure.

10. The light emitting device package according to claim 9, wherein the two diffusion regions have a common polarity.

11. The light emitting device package according to claim 10, wherein the two diffusion regions have a polarity different from that of a region of the package structure where the diffusion regions are not formed.

12. The light emitting device package according to claim 1,
    wherein the first electrode and second electrode each include a side electrode potion connected to an outer side of the package structure, the side electrode potion connecting the upper electrode portion and lower electrode portion.

13. The light emitting device package according to claim 1, wherein the at least one diffusion region is located on the second surface of the package structure.

14. The light emitting device package according to claim 1, wherein the first surface and the second surface are substantially parallel.

15. A light emitting device package, comprising:
    a package structure having a mounting groove, an upper surface and a lower surface, the lower surface being opposite to the upper surface;
    at least one diffusion layer formed on the package structure; and
    a pair of electrodes insulated from the package structure by an insulation film, wherein
    one of the pair of electrodes is electrically connected with a corresponding one of the at least one diffusion layer, and
    each of the pair of electrodes include electrode portions located on the upper surface and the lower surface of the package structure.

16. The light emitting device package according to claim 15,
    wherein each of the pair of electrodes include a side electrode potion connected to an outer side of the package structure, each side electrode potion connecting the respective electrode portions located over the upper surface and the lower surface of the package structure.

17. The light emitting device package according to claim 15, further comprising a light emitting diode disposed in the mounting groove.

18. The light emitting device package according to claim 15, wherein the at least one diffusion region is located on the lower surface of the package structure.

19. The light emitting device package according to claim 15, wherein the upper surface and the lower surface are substantially parallel.

20. A method of manufacturing a light emitting device package, comprising:
  applying a mask on a first surface and a second surface of a substrate;
  exposing the substrate to light;
  selectively etching the substrate and forming a mounting groove and through-holes;
  forming at least one diffusion layer on the first surface of the substrate; and
  forming a first electrode and a second electrode on the first surface and the second surface, the first electrode and the second electrode being connected via the through-holes such that the first electrode and the second electrode are insulated from the substrate and are electrically connected with the at least one diffusion layer; and
  bonding a light emitting device to the mounting groove via a conductive bonding agent such that the light emitting device is electrically connected with the first electrode and the second electrode.

21. The method according to claim 20, the step of selectively etching the substrate and forming a mounting groove comprising:
  forming an inclined side surface on the mounting groove.

22. The method according to claim 20, wherein the light emitting package includes plural light emitting packages, the method further comprising:
  separating the plural light emitting device packages from each other.

23. The method according to claim 22,
  wherein the etching the substrate is performed by a wet-type etching fashion through a bulk micro machining process to form the through-holes through the substrate such that the light emitting device packages are divided from each other by the through-holes and to form the mounting groove in each light emitting device package.

* * * * *